United States Patent
Seki

(10) Patent No.: US 7,106,770 B2
(45) Date of Patent: Sep. 12, 2006

(54) MULTILASER DEVICE FOR RECEIVING A PLURALITY OF BACK BEAMS BY A COMMON SENSOR

(75) Inventor: Yuichi Seki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 10/649,625

(22) Filed: Aug. 28, 2003

(65) Prior Publication Data

US 2004/0047377 A1      Mar. 11, 2004

(30) Foreign Application Priority Data

Sep. 10, 2002 (JP) .............................. 2002-263992

(51) Int. Cl.
*H01S 5/00* (2006.01)
(52) U.S. Cl. .......................................... 372/43; 372/50

(58) Field of Classification Search ................... 372/32
See application file for complete search history.

(56) References Cited

U.S. PATENT DOCUMENTS

| 5,625,189 A | * | 4/1997 | McCaul et al. | ............. 250/343 |
| 6,560,256 B1 | | 5/2003 | Seki et al. | ................ 372/38.02 |
| 6,757,311 B1 | * | 6/2004 | Abe | ............................. 372/43 |

* cited by examiner

*Primary Examiner*—James Vannucci
(74) *Attorney, Agent, or Firm*—Fitzpatrick, Cella, Harper & Scinto

(57) ABSTRACT

A multilaser device has a first laser chip and a second laser chip produced from one and the same wafer lot, a common back beam sensor for receiving a first back beam and a second back beam emitted from the first laser chip and the second laser chip, respectively, and a package containing the first laser chip, the second laser chip and the back beam sensor.

3 Claims, 3 Drawing Sheets

MULTILASER DEVICE FOR RECEIVING A PLURALITY OF BACK BEAMS BY A COMMON SENSOR

BACKGROUND OF THE INVENTION

1. Field of the Invention

This invention relates to a multilaser device suitably used in an electrophotographic apparatus and emitting a plurality of laser beams.

2. Description of Related Art

A multibeam laser has heretofore been of a monolithic construction provided with a plurality of light emitting portions on a laser diode chip. In an image forming apparatus of an electrophotographic type, a plurality of beams are caused to scan by the use of this multibeam laser, and are applied onto a photosensitive drum to thereby effect latent image forming.

In the above-described monolithic type, however, an electric current is supplied to one of the plurality of light emitting portions on the laser diode chip, whereby from the heat generation thereof, the threshold value electric currents of the other light emitting portions are increased and further, this leads to a reduction in the quantity of emitted light. This phenomenon is particularly remarkable in an increase in a driving current resulting from the heightening of a light output. In the image forming apparatus, such a reduction in the quantity of emitted light results in the uneven density of an image and deteriorates the quality of printing.

As one of methods of solving the above-noted problem, there is a method of carrying a plurality of laser diode chips to thereby form a multibeam, but this method gives rise to the problem that depending on the mounting accuracy of the laser diode chips in a semiconductor laser, the distance from a light emitting point to a photosensitive drum differs among the laser diode chips, whereby the converging property of a spot becomes uneven.

SUMMARY OF THE INVENTION

It is an object of the present invention to provide a multilaser device in which heat interference among a plurality of laser diodes is reduced.

It is another object of the present invention to provide a multilaser device using a plurality of laser chips approximate in optical-electric characteristic to one another.

It is still another object of the present invention to provide a multilaser device having:

a first laser chip and a second laser chip produced from one and the same wafer lot;

a common back beam sensor for receiving a first back beam and a second back beam emitted from the first laser chip and the second laser chip, respectively; and a package containing therein the first laser chip, the second laser chip and the back beam sensor.

Further objects of the present invention will become apparent from the following description.

DESCRIPTION OF THE PREFERRED EMBODIMENTS

Some embodiments of the present invention will hereinafter be described with reference to the drawings.

Figure 3:
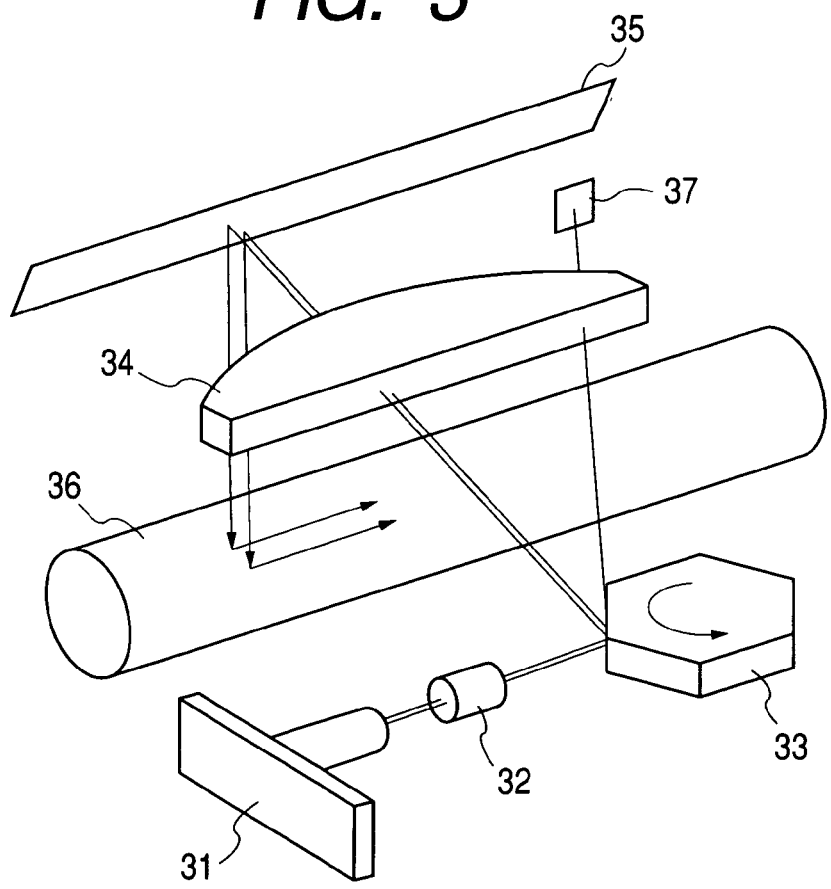
FIG. 3 shows the construction of an optical scanning apparatus using the multilaser device according to the first embodiment.

FIG. 3 shows the essential portions of an electrophotographic apparatus using a multilaser device according to an embodiment of the present invention.

The electrophotographic apparatus is comprised of a laser driving unit 31 including a semiconductor multibeam laser, a collimator lens 32 for collimating a laser beam emitted from the laser driving unit 31, a polygon mirror 33, an f-θ lens 34, a reflecting mirror 35 and a photosensitive drum 36.

The laser beam emitted from the laser driving unit 31 enters the collimator lens 32 and arrives at the polygon mirror 33. The polygon mirror 33 is rotated at a uniform angular speed by a scanner motor (not shown). The laser beam having arrived at the polygon mirror 33 is deflected by the polygon mirror 33, and is converted by the f-θ lens 34 so as to scan at a uniform speed in a direction perpendicular to the direction of rotation of the photosensitive drum 36, and is received in a non-image area by a light receiving sensor 37 comprised of a photodiode.

In an image area, the laser beam emerges from the f-θ lens 34, and thereafter irradiates the surface of the photosensitive drum 36 via the reflecting mirror 35.

Figure 1:
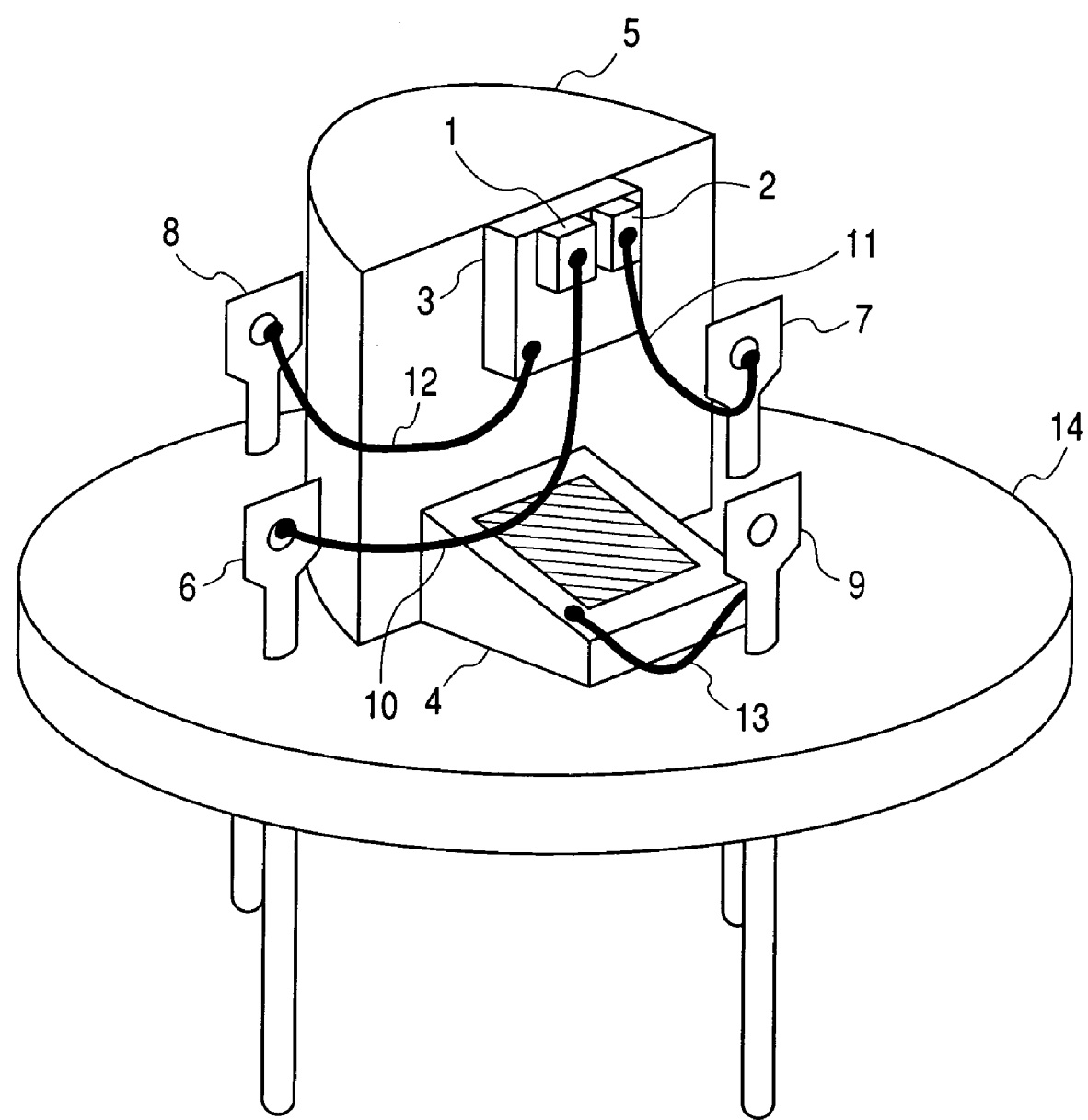
FIG. 1 shows the construction of a multilaser device according to a first embodiment of the present invention.

FIG. 1 shows a portion of the construction of the semiconductor multibeam laser device which is an embodiment of the present invention. The reference numeral 1 designates a laser diode (hereinafter abbreviated as LD) chip a, and the reference numeral 2 denotes a laser diode (hereinafter abbreviated as LD) chip b, and these are chips produced from one and the same wafer. A sub-mount 3 supports the LD chip a 1 and the LD chip b 2. The LD chip a 1 and the LD chip b 2 are disposed at a predetermined interval on the sub-mount 3. The multibeam laser device is further comprised of a photodiode (hereinafter abbreviated as PD) 4 for receiving back beams from the LD chip a 1 and the LD chip b 2, a heat sink 5 for suppressing the heat generation of the LD chip a 1 and the LD chip b 2, an electrode 6 for the LD chip a 1, an electrode 7 for the LD chip b 2, an electrode 8 for supplying a common voltage to the LD chip a 1 and the LD chip b 2 via an electrode (not shown) formed on the sub-mount 3, an electrode 9 for the PD, a bonding wire 10 for connecting the LD chip a 1 and the electrode 6 for the LD chip a 1 together, a bonding wire 11 for connecting the LD chip b 2 and the electrode 7 for the LD chip b 2 together, a bonding wire 12 for connecting the electrode on the sub-mount 3 and the electrode 8 together, a bonding wire 13 for connecting the PD 4 and the electrode 9 for the PD together, and a stem 14.

Figure 2:
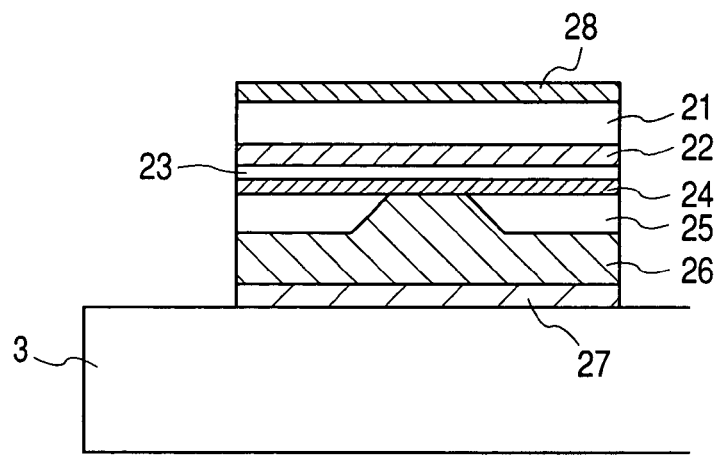
FIG. 2 shows the popular construction of a laser diode chip used in the multilaser device according to the first embodiment.

FIG. 2 shows the structure of the LD chip used in the semiconductor multibeam laser of the present invention. A junction down type in which for crystal growth, the LD chip is inverted and connected to the sub-mount 3 will hereinafter be described as an example.

The LD chip is such that an n-AlGaAs clad layer 22, an AlGaAs active layer 23, a p-AlGaAs clad layer a 24 and an n-GaAs electric current block layer 25 are crystal-grown on an n-GaAs substrate 21. Further it is etched into a ridge shape so as to form such striped structure as forms a p-AlGaAs clad layer b 26. An electric current passes in a concentrated manner through a ridge groove formed by the n-GaAs electric current block layer 25. The reference numeral 27 designates a p electrode, and the reference numeral 28 denotes an n electrode.

Second Embodiment

Figure 4:
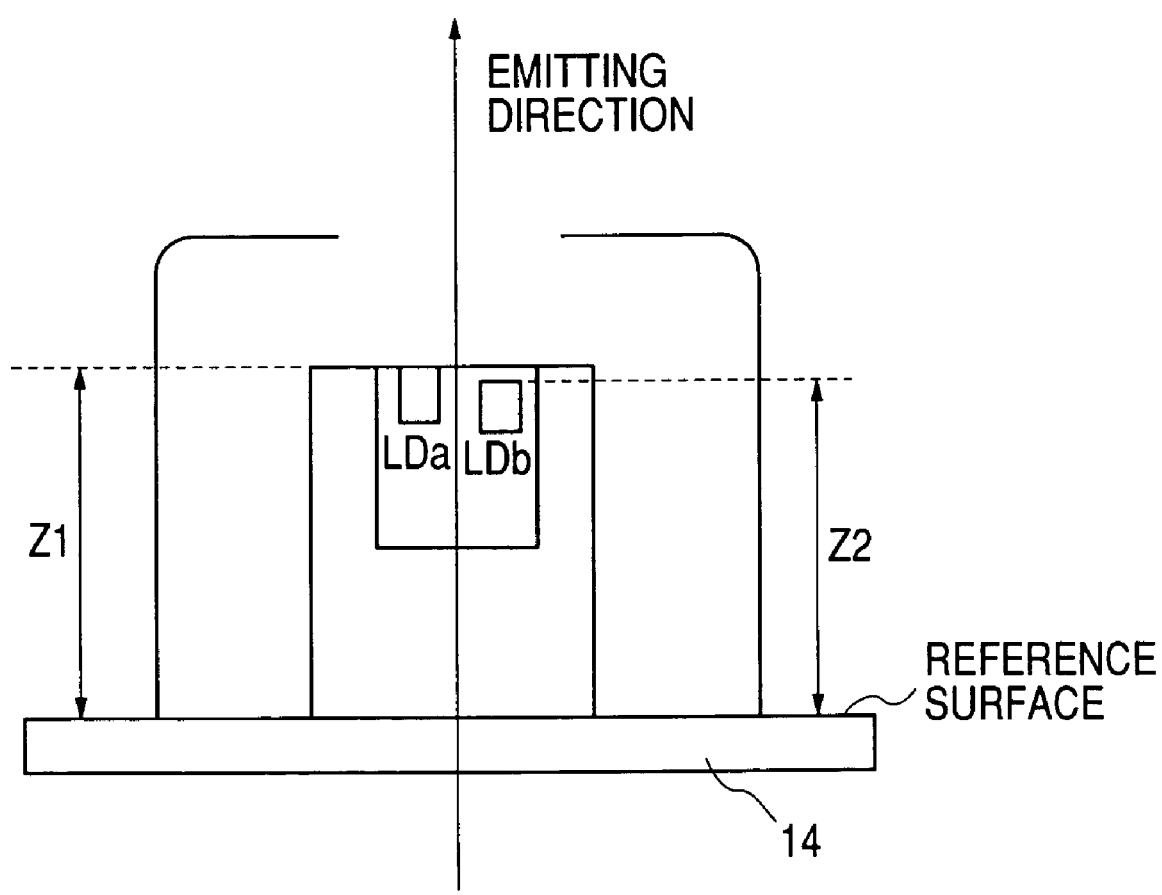
FIG. 4 is a block diagram showing the construction of a beam pitch control circuit in a second embodiment of the present invention.

FIG. 4 is a schematic view of the internal structure of the semiconductor multibeam laser illustrating second and third embodiments of the present invention. The part surface of the stem 14 provides a reference surface when the semiconductor multibeam laser apparatus is mounted on a laser driving unit 31. The LD chip a 1 and the LD chip b 2 are mounted on the sub-mount 3 so that the distance to the light emitting point of the LD chip a 1 and the distance to the light emitting point of the LD chip b 2 may be equal to each other relative to the reference surface of the stem 14.

Assuming here that the distance to the light emitting point of the LD chip a 1 relative to the reference surface of the stem 14 is Z1 and the distance to the light emitting point of the LD chip b 2 relative to the reference surface of the stem 14 is Z2, the relative difference in the positional accuracy of the light emitting points is defined as shown by the following expression (1):

$$\text{relative difference } \Delta Z \text{ in the positional accuracy of the light emitting points} = |Z1-Z2| \quad (1)$$

Design is made such that the relative difference between the respective optical-electric characteristics of the plurality of laser diode chips at a predetermined quantity of emitted light satisfies both of the two expressions that oscillation wavelength $\lambda \leq 1.5$ nm and positional accuracy of the light emitting points: $\Delta Z \leq 5$ µm.

Further, the optical-electric characteristics of the laser diode chip includes an oscillation threshold value current which is a current value necessary when the laser diode chip starts laser beam emission and a driving current-light output characteristics representing the relation of a quantity of emitted light to a current value for driving the laser diode chip. It will be better if the relative differences between the respective optical-electric characteristics of the plurality of laser diode chips at a predetermined quantity of emitted light satisfy the followings:

oscillation threshold value current: $Ith \leq 2$ mA driving current-light output: $\eta \leq 0.05$ mW/mA light output-photodiode output current: $Im \leq 20\%$.

As described above, according to the first embodiment, there is achieved the effect that the heat interference of the laser diode is minimized and a stable light output is obtained. According to the second embodiment, there is achieved the effect that the characteristic of the semiconductor multilaser beam device comprised of a plurality of laser diode chips is stabilized.

What is claimed is:

1. A multilaser device used in an image forming apparatus to form an electrostatic image on a photosensitive member, said multilaser device comprising:

a first laser chip produced from a wafer lot;

a second laser chip produced from the same wafer lot as that of the first laser chip, a layer structure of said second laser chip being the same as a layer structure of said first laser chip;

a common back beam sensor for receiving a first back beam and a second back beam emitted from said first laser chip and said second laser chip, respectively; and a package containing said first laser chip, said second laser chip and said back beam sensor.

2. A multilaser device according to claim 1, wherein a difference $\lambda$ between osculation wavelengths of said first laser chip and said second laser chip is $\lambda \leq 1.5$ nm.

3. A multilaser device according to claim 1, wherein positional accuracy $\Delta Z$ of light emitting points of said first laser chip and said second laser chip is $\Delta Z \leq 5$ µm.

* * * * *

UNITED STATES PATENT AND TRADEMARK OFFICE
CERTIFICATE OF CORRECTION

| | | |
|---|---|---|
| PATENT NO. | : 7,106,770 B2 | Page 1 of 1 |
| APPLICATION NO. | : 10/649625 | |
| DATED | : September 12, 2006 | |
| INVENTOR(S) | : Yuichi Seki | |

It is certified that error appears in the above-identified patent and that said Letters Patent is hereby corrected as shown below:

COLUMN 4
      Line 33, "osculation" should read --oscillation--.

Signed and Sealed this

Twenty-seventh Day of March, 2007

JON W. DUDAS
*Director of the United States Patent and Trademark Office*